United States Patent
Agarwal et al.

(10) Patent No.: US 7,423,446 B2
(45) Date of Patent: Sep. 9, 2008

(54) CHARACTERIZATION ARRAY AND METHOD FOR DETERMINING THRESHOLD VOLTAGE VARIATION

(75) Inventors: Kanak B. Agarwal, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 11/462,186

(22) Filed: Aug. 3, 2006

(65) Prior Publication Data
US 2008/0030220 A1  Feb. 7, 2008

(51) Int. Cl.
*G01R 31/26* (2006.01)
(52) U.S. Cl. .................... 324/769; 324/763; 324/765
(58) Field of Classification Search .......... 324/769, 324/770, 765, 158.1, 763; 702/64, 65, 81, 702/170; 365/185.22–185.24; 438/14–17
See application file for complete search history.

(56) References Cited

U.S. PATENT DOCUMENTS

| | | | | |
|---|---|---|---|---|
| 5,331,209 A | * | 7/1994 | Fujisawa et al. ............ 327/545 |
| 5,780,884 A | * | 7/1998 | Kumagai et al. ............ 257/236 |
| 6,201,737 B1 | * | 3/2001 | Hollmer et al. ........ 365/185.16 |
| 6,370,061 B1 | * | 4/2002 | Yachareni et al. ...... 365/185.22 |
| 6,492,802 B1 | * | 12/2002 | Bielski ..................... 324/158.1 |
| 6,873,173 B2 | * | 3/2005 | Kollmer et al. ............. 324/769 |
| 7,038,482 B1 | * | 5/2006 | Bi .............................. 324/769 |
| 2005/0043908 A1 | * | 2/2005 | Bhavnagarwala et al. ..... 702/64 |

OTHER PUBLICATIONS

U.S. Appl. No. 11/422,913, filed Jun. 8, 2006, Agarwal et al.

* cited by examiner

*Primary Examiner*—Ha Nguyen
*Assistant Examiner*—Arleen M Vazquez
(74) *Attorney, Agent, or Firm*—Mitch Harris, Atty at Law, LLC; Andrew M. Harris; Casimer K. Salys

(57) ABSTRACT

A method for determining threshold voltage variation rapidly provides accurate threshold voltage distribution values for process verification and improvement. The method operates a characterization away including a circuit for imposing a fixed drain-source voltage and a constant channel current at individual devices within the array, while sensing the source voltage of the individual device. The statistical distribution of the threshold voltage is determined directly from the source voltage distribution by offsetting each source voltage by a value determined by completely characterizing one or more devices within the array. The resulting methodology avoids the necessity of otherwise characterizing each device within the array, thus reducing measurement time dramatically.

4 Claims, 4 Drawing Sheets

CHARACTERIZATION ARRAY AND METHOD FOR DETERMINING THRESHOLD VOLTAGE VARIATION

BACKGROUND OF THE INVENTION

1. Field of the Invention

The present invention is related to device characterization methods and circuits, and more particularly to a circuit for determining threshold voltage variation of devices within an array.

2. Description of Related Art

Threshold voltage variation has become significant as processes have shrunk. As process technologies have evolved, random doping fluctuation (RDF) has emerged as a dominant and less controllable factor in device parameter variation. RDF has the statistical effect of generating threshold voltage variations, as the number and location of dopant atoms in the channel region can vary significantly from device to device, even though the overall doping density of a process layer for the entire wafer is well-controlled. Threshold voltage "scatter" is a term used to refer to the spread of threshold voltage.

Software models can be employed to determine the effects of RDF on circuit performance; however, in order to accurately determine the actual RDF, it is typically necessary to characterize RDF using a test circuit. Threshold voltage variation due to RDF can be characterized by measuring a large number of devices typically arranged in an addressable manner in an array-type test structure. However, full characterization of an array is a time-intensive procedure, since the channel current vs. gate voltage curve must be sampled for each individual device to gather threshold voltage statistics that describe the array. There is no direct measure of threshold voltage in a device; therefore, it is generally necessary to either measure the slope of the gate voltage vs. drain current curve to extrapolate $V_T$ or estimate $V_T$ using a fixed reference current. Either of the above-mentioned methods for measuring threshold voltage require many measurements for each device in the array.

For a square array of order N, the required measurement time is N-squared proportional, and for large arrays at present, the measurements typically require cycles of more than a day to complete. As array sizes increase, the result is unacceptable delays in design turn time, especially when determining factors for a process scaling over a large range of options.

Therefore, it would be desirable to provide a characterization method and circuit for determining threshold voltage variation within arrays of devices that can reduce the characterization time while accurately providing the threshold voltage statistics for an entire array.

SUMMARY OF THE INVENTION

The above objectives of reducing characterization time for determining threshold voltage variation within an array is achieved in characterization array and method.

The method may be embodied in a computer system executing program instructions for carrying out the steps of the method and may further be embodied in a computer program product containing program instructions in computer-readable form for carrying out the steps of the method.

The method fully characterizes at least one device in an array to determine a relationship between the source voltage and threshold voltage for the device. Then, a circuit within the characterization array is enabled to fix the drain-source voltage, gate voltage and drain current for each individual device within the array and the source voltage of each device is sensed and measured.

The measured source voltage values are adjusted according to the determined source-threshold voltage relationship for the fully-characterized device, and the statistics of the threshold voltage are computed from the resulting adjusted values. The result is a statistical description of the distribution of threshold voltages for the array.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

The present invention relates to a threshold voltage characterization method performed using a characterization array in accordance with an embodiment of the present invention. The method may be a computer-performed method embodied in a computer program having program instructions for carrying out the method. A characterization array is used in the method and may be controlled by computer to provide a measure of threshold voltage for each device in the array. The variation in threshold voltage over the entire array may then be observed from the measurement data. The method of the present invention dramatically reduces the amount of time to characterize the threshold voltage variation within an array, permitting greater flexibility in design decisions associated with process scaling and other process adjustments and in verification of designs.

Figure 1A:
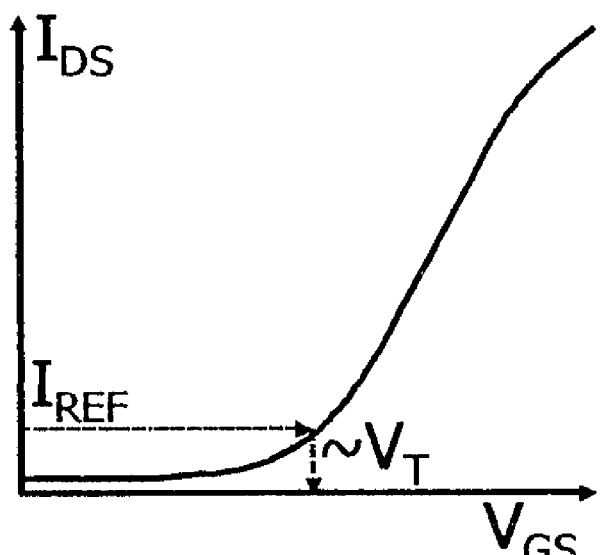
FIGS. 1A-1C are pictorial diagrams depicting various models for threshold voltage that may be used in methods according to embodiments of the present invention.
Figure 1B:
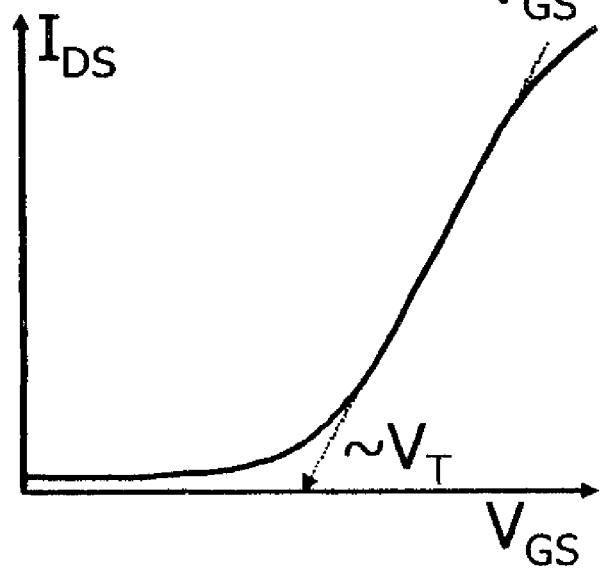
Figure 1C:
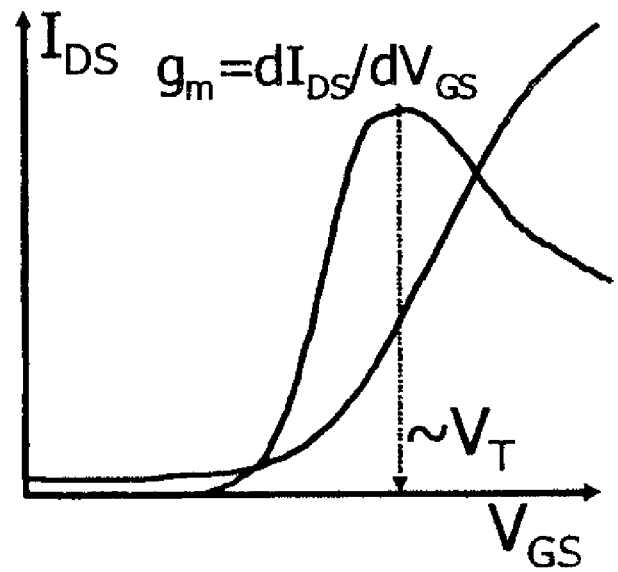

Referring now to FIGS. 1A-1C, various definitions of threshold voltage as known in the art are shown in graphs of drain-source current $I_{DS}$ versus gate-source voltage $V_{GS}$. FIG. 1A shows a threshold voltage ($V_T$) model in which the threshold voltage is specified as a particular $V_{GS}$ that produces a predetermined reference current ($I_{REF}$) through the channel of the device. FIG. 1B shows a threshold voltage model in which the linear (active) region slope of $I_{DS}$ versus $V_{GS}$ is projected to a $V_{GS}$ value that would produce $I_{DS}$=0 if the active region slope continued to $I_{DS}$=0. Finally, FIG. 1C shows a model of threshold voltage in which the threshold voltage is specified as the point of maximum slope of $I_{DS}$ versus $V_{GS}$, which is the point of maximum transconductance $g_m$=$dI_{DS}/dV_{GS}$.

The present invention does not limit the definition of threshold voltage to any particular threshold voltage model, but provides a methodology in which threshold voltage according to any of the above-described models, or any other suitable threshold voltage model, may be measured over an entire array without requiring full characterization of $I_{DS}$ versus $V_{GS}$ device behavior for each device in the array.

The following equations express the behavior of a Metal-Oxide field effect transistor (MOSFET) over three regions of operation:

$$I_{DS} = \begin{cases} I_0 \frac{W}{L} e^{\frac{V_{GS}-V_T}{S_S}} \left(1 - e^{\frac{-V_{DS}}{(kT/q)}}\right) & V_{GS} < V_T \text{(Cut-off)} \\ k\frac{W}{L}\left((V_{GS}-V_T)V_{DS} - \frac{V_{DS}^2}{2}\right) & V_D < V_{DSAT} \text{(Linear)} \\ k'\frac{W}{L}(V_{GS}-V_T)^\alpha (1+\lambda V_{DS}) & V_D > V_{DSAT} \text{(Saturation)} \end{cases}$$

In each of the regions described by the equations above, dependency of the channel current $I_{DS}$ on threshold voltage $V_T$, appears as a dependency on $V_{GS}-V_T$. Therefore, if a measurement is made for each device that enforces a predetermined $I_{DS}$ and $V_{DS}$, then any variation in $V_T$ will cause a corresponding and equal change in $V_{GS}$. If $V_G$ is also fixed, then any variation in $V_T$ will cause a corresponding and opposite change in $V_S$.

Figure 2A:
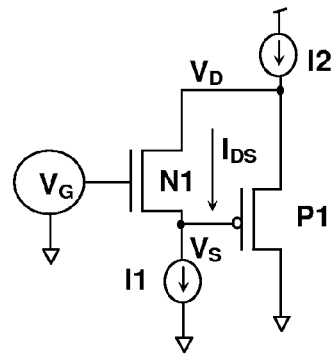
FIG. 2A is a schematic diagram of a characterization circuit.

Referring now to FIG. 2A, a characterization circuit in accordance with an embodiment of the present invention is depicted. Transistor N1 is a device under test for which the threshold voltage $V_T$ is to be determined. Transistor P1 and current source I2 form a source-follower that imposes a constant $V_{DS}$ value across the channel of transistor N1, since the amount of current diverted through transistor P1 will increase as $V_S$ decreases, causing an equal change in $V_D$. Transistor P1 is generally a thick oxide device having a long channel and operated in the saturation region. Current source I1 fixes the channel current $I_{DS}$ through transistor N1. A constant voltage $V_G$ is imposed on the gate of transistor N1. Therefore, any variation in the threshold voltage ($\Delta V_T$) of device N1 will appear directly as an opposite change in source voltage ($\Delta V_S$) in the depicted measurement circuit, since $\Delta V_G=0$, $\Delta I_{DS}=0$ and according to the above equations, $\Delta(V_{GS}-\Delta V_T)=0$.

Figure 2B:
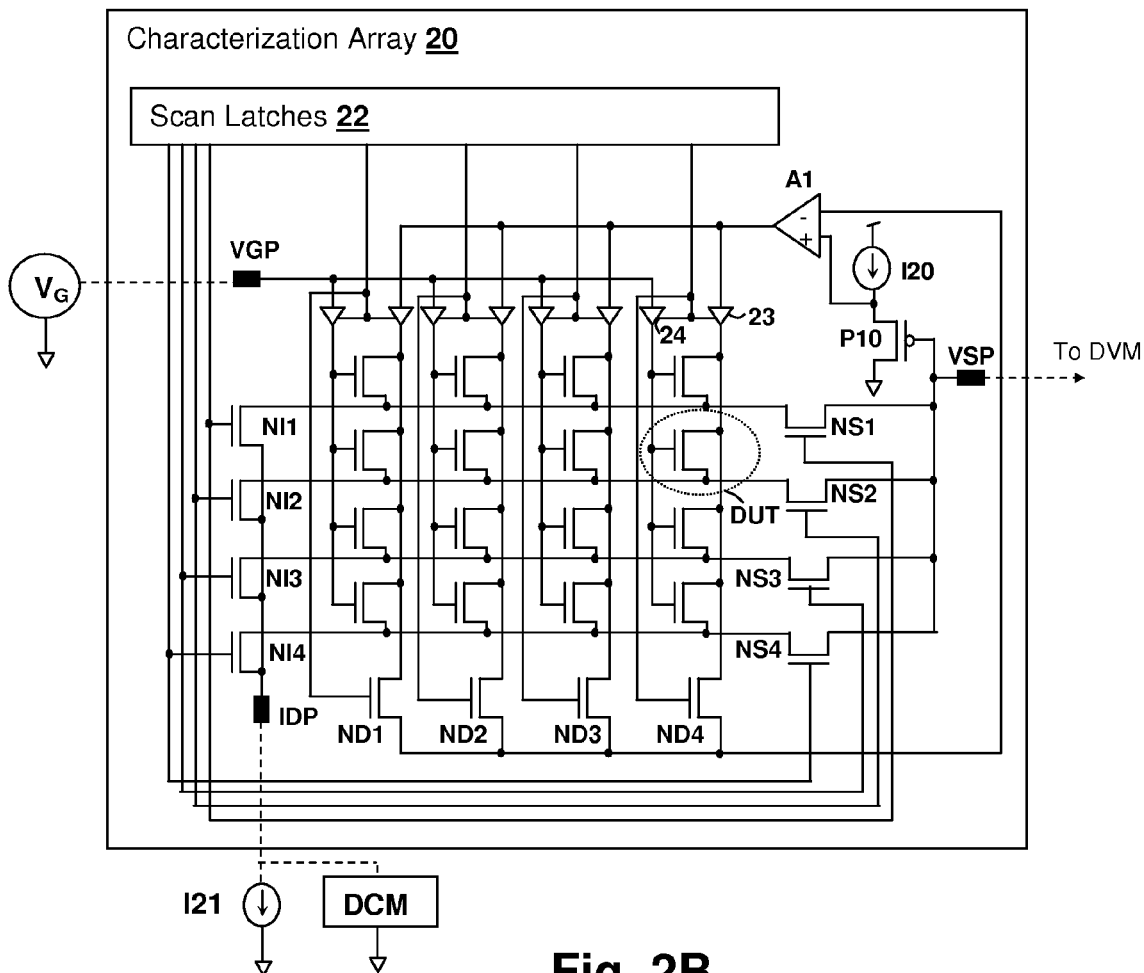
FIG. 2B is a schematic of a characterization array, in accordance with embodiments of the present invention.

Referring now to FIG. 2B, a characterization array 20 in accordance with an embodiment of the present invention is shown. Characterization array 20 is a test integrated circuit integrated on a die, a wafer kerf or other integrated circuit location that may be experimental only, or occupy one or more die or kerf locations in a production wafer. An array of transistors including device under test DUT is operated in a controlled manner via signals provided by scan latches 22. Although the exemplary embodiment uses scan latches 22 to apply the control signals, it is understood that registers controlled via a control interface or other suitable circuit may be provided to control the operation of characterization array 20. Further, it is understood that although the exemplary embodiment supplies signals to external equipment via pads VGP, IDP and VSP, one or more of the external devices used to operate and evaluate device under test DUT may be integrated within characterization array 20. For example, any or all of voltage source $V_G$, current source I21 and a voltage measurement circuit for measuring the voltage at pad VSP can be integrated on a wafer including characterization array 20.

Signals provided from scan latches 22 select a unique row and column associated with one of the transistors, e.g., device under test DUT. The selection of a row is made by a logical "1" applied to the gate of one of current steering transistors NI1-NI4 and simultaneously to a gate of a corresponding one of source voltage sense transistors NS1-NS4. Scan latches 22 are programmed such that only one row is selected at a time, i.e., all gates of transistors NI1-NI4 and NS1-NS4 are set to logical "0", other than the gates corresponding to the selected row. The selection of a column is made by enabling a buffer, e.g., buffer 24 that applies a reference gate voltage provided at pad VGP to the gates of all of the transistors in a column of the transistor array. A corresponding buffer 23 is also enabled and applies the output of amplifier A1 to the drain of each transistor in the selected column. The gate of a corresponding drain voltage sense transistor ND1-ND4 for the selected column is also set to a logic "1", and provides a sense path for sensing the drain voltage of a column at the inverting input of amplifier A1. Scan latches 22 are programmed such that only one column is selected at a time, i.e., all buffer enable inputs and drain voltage sense transistor ND1-ND4 gates are set to logical "0" other the enable inputs of the buffers corresponding to the selected column and the gate of the corresponding drain voltage sense transistor ND1-ND4.

The source follower circuit described with reference to FIG. 2A is included within characterization array 20, but includes amplifier A1, which forces the drain-source voltage ($V_{DS}$) to be a constant value for each selected transistor in the array. For example, when transistor DUT is selected by enabling buffers 23 and 24 and transistors ND4, NI2 and NS2, transistor ND4 applies the drain voltage of transistor DUT to the inverting input of amplifier A1. Simultaneously, transistor NS2 applies the source voltage of transistor DUT to the gate of source-follower transistor P10, which controls the voltage at the non-inverting input of amplifier A1. The feedback loop acts to hold the drain-source voltage of transistor DUT constant by tracking any changes in the source voltage sensed from the selected row and adjusting the drain voltage supplied to the transistors in the column by an equal amount. Only one of the transistors in the array is conducting current at any time. Current provided from the output of A1 is directed through buffer 23 through the channel of transistor DUT and through transistor NI2 to an external stable current source I21. Since the current output of amplifier A1 is supplied to the drains of each transistor in a selected column, but only one selected row has a return path enabled via one of transistors NI1-NI4, only one device is selected for characterization for each valid combination of row and column selection signals provided from scan latches 22.

The above-described characterization array 20 thus provides a mechanism for uniquely selecting each device in the array and sensing changes in the source voltage $V_S$ at pad VSP for a fixed operating point set by the channel current $I_{DS}$ permitted through pad IDP and the gate voltage $V_G$ applied at pad VGP. By setting different valid selection combinations in scan latches 22, each transistor in the array is selected and a value of $V_S$ is measured and collected, for example by an external computer-controlled digital voltmeter (DVM). Since the changes in $V_S$ can thereby be characterized for the entire array, the difference between $V_S$ and $V_T$ need only be measured for one device, by fully characterizing the $I_{DS}$ versus $V_{GS}$ behavior of one of the transistors in the array, e.g. transistor DUT.

The full characterization of transistor DUT can be performed by selecting transistor DUT as described above and varying the value of the voltage applied to pad VGP, with current source I21 replaced by a current measuring circuit, such as a digital current meter DCM. The behavior of $I_{DS}$ versus $V_{GS}$ is then obtained by recording the current produced from pad IDP versus the gate voltage applied to pad VGP minus the source voltage observed at pad VSP. The threshold voltage can be then determined in conformity with one of the models depicted in FIGS. 1A-1C, or any other suitable threshold voltage model. The source voltage data obtained over the entire array is then be normalized by computing the difference between the source voltage measured for the fully-characterized transistor during the array tests and the threshold voltage determined from the model and subtracting that value from each of the source voltage data points collected during the array measurements. Effectively, the above-described operation is the same as normalizing all source voltages to a particular device by subtracting the source voltage measurement for the particular device to find a deviation value for each device. Then, the threshold voltage for the particular device is determined from full characterization and the threshold voltage for the other devices is determined by subtracting the source voltage deviation for the other device.

Figure 3:
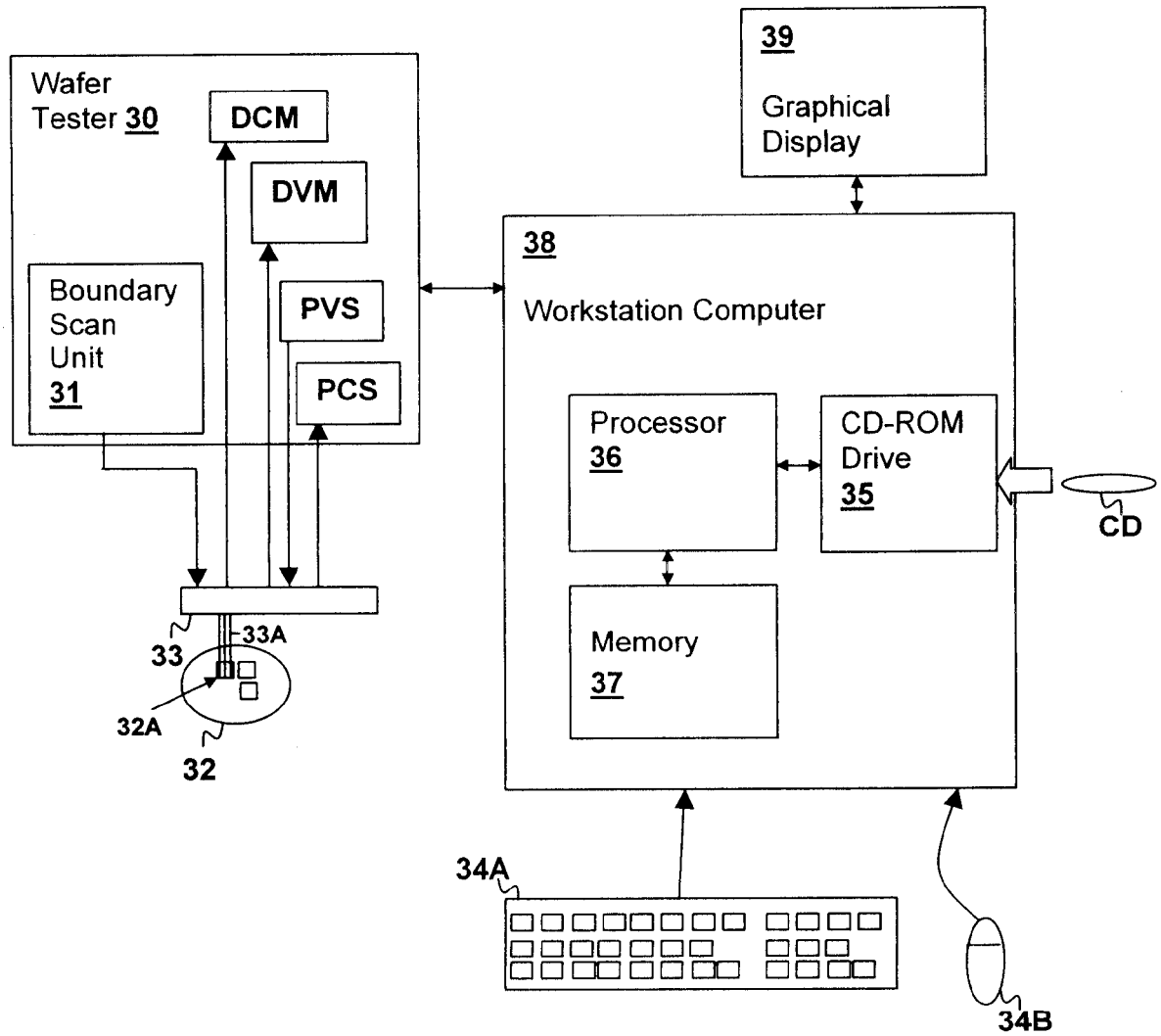
FIG. 3 is a pictorial diagram of a wafer test system in which methods in accordance with an embodiment of the present invention are performed.

Referring now to FIG. 3, a wafer test system in which a method according to an embodiment of the invention is performed, is shown. A wafer tester 30 includes a boundary scan unit 31 for providing stimulus to a die or kerf circuit 32A on a wafer under test 32, via a probe head 33 having electrical test connections 33A to die 32A. Wafer tester 30 also includes a digital voltmeter DVM, which may be part of a parametric measurement unit that also includes a programmable voltage source PVS, a programmable current source PCS, and a digital current meter DCM, that are all coupled to die 32A via probe head 33 electrical test connections 33A. The output of programmable voltage source is connected to pad VGP, the output of programmable current source PCS is connected to pad IDP and the input of digital voltmeter DVM is connected to pad VSP.

A workstation computer 38, having a processor 36 coupled to a memory 37, for executing program instructions from memory 37, wherein the program instructions include program instructions for executing one or more methods in accordance with an embodiment of the present invention, is coupled to wafer tester 30, whereby the measurements described above are performed and measurements collected and stored in memory 37 and/or other media storage such as a hard disk. A CD-ROM drive 35 provides for import of program instructions in accordance with embodiments of the present invention that are stored on media such as compact disc CD. Workstation computer 38 is also coupled to a graphical display 39 for displaying program output such as distributions of the threshold voltage for devices in the characterization array provided by embodiments of the present invention. Workstation computer 38 is further coupled to input devices such as a mouse 34B and a keyboard 34A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 38. Further, workstation computer 38 may be coupled to wafer tester 30 by such a network connection.

While the system of FIG. 3 depicts a configuration suitable for sequential test of a plurality of dies on a wafer, the depicted system is illustrative and not a limitation of the present invention. Probe head 33 may be a multi-die full wafer probe system, or may comprise multiple probe heads for simultaneously testing multiple wafers on a single or multiple die basis. Additionally, while boundary scan control of the characterization array is illustrated, the techniques of the present invention may also be applied to execution of test code from a processor incorporated on wafer 32 with appropriate current and voltage sources and voltage measurement circuitry provided on wafer 32, as well. The resultant generated display or data exported from workstation computer 38 may take the form of graphical depictions of the threshold voltage variation across the characterization array, or may graphical or numerical statistical distribution information that describes the threshold voltage variation.

Figure 4:
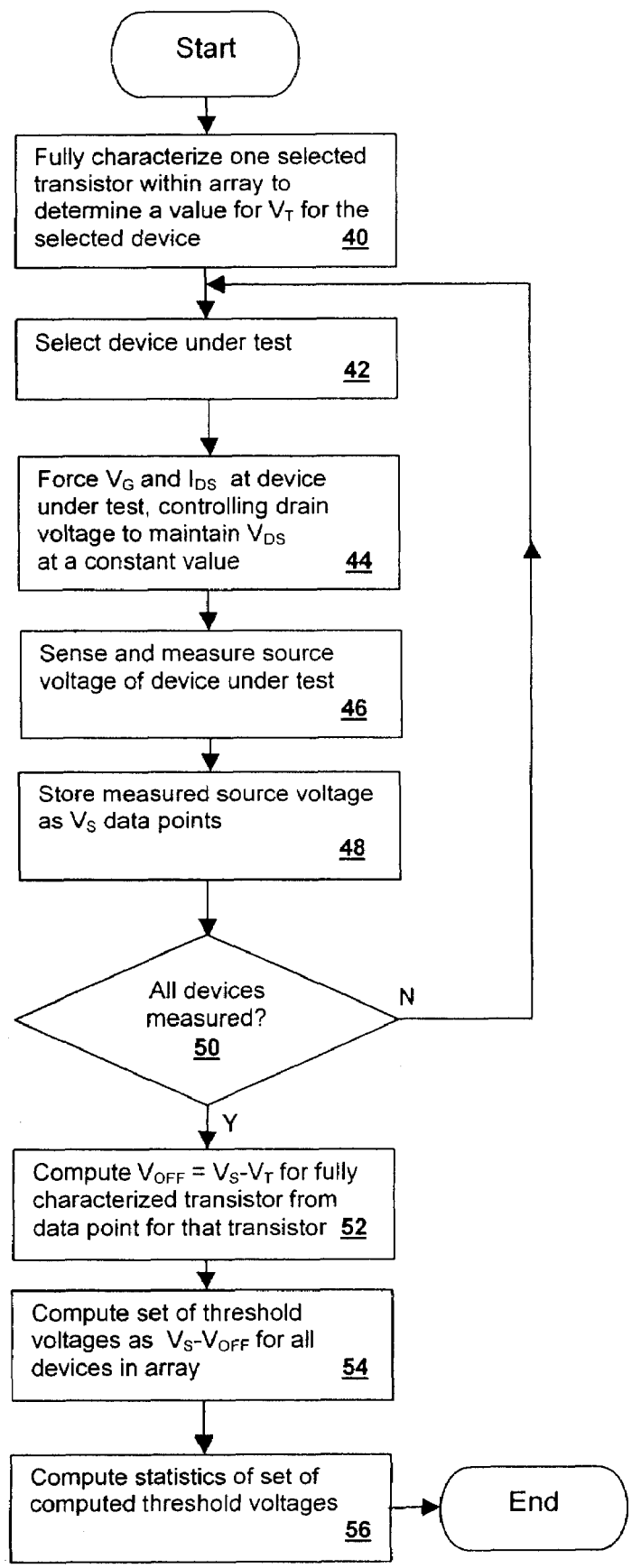
FIG. 4 is a flow chart of a method in accordance with an embodiment of the present invention.

Referring now to FIG. 4, a method in accordance with an embodiment of the invention is depicted in a flowchart. First, one transistor is selected and fully characterized to determine the threshold voltage for that transistor (step 40). Next one of the devices (which may be the fully-characterized device) is selected (step 42), the gate voltage and drain-source current are forced to predetermined values and the drain voltage is controlled to maintain the drain-source voltage at another predetermined value (step 44). The source voltage of the selected device is then sensed and measured (step 46) and the measured source voltage is stored in a collection of $V_S$ data points (step 48). Until the source voltage has been measured for all devices (decision 50), steps 42-48 are repeated, selecting a different device each repetition of step 42.

After the source voltage for all of the devices has been measured, the offset between the source voltage measured in step 48 for the fully-characterized device and the threshold voltage determined in step 40 for the fully-characterized device is computed (step 52). Next the set of threshold voltages for the entire array is determined by subtracting the offset determined in step 52 from each $V_S$ data point collected in step 48, yielding the threshold voltage set for the entire array (step 54). Finally, statistics of the threshold voltage variation are computed and displayed (step 56).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for characterizing threshold voltage variation in an array of devices, the method comprising:
    selecting a device within said array as a device under test;
    providing a predetermined current through a channel of said device under test while providing a predetermined channel voltage across said channel and a predetermined gate voltage at a gate terminal of said device under test;
    measuring a source voltage at a source terminal of said device under test;
    repeating said selecting, said providing and said measuring for multiple devices within said array to obtain a set of source voltage measurements;
    computing a set of threshold voltages for said multiple devices from said set of source voltage measurements by applying an adjustment value; and
    analyzing said set of threshold voltages to generate a description of said threshold voltage variation, wherein said providing a predetermined current through a channel of said device while providing a predetermined channel voltage across said channel is performed by coupling an input of a source follower circuit to said source terminal of said device under test and coupling an output of said source follower circuit to a drain terminal of said device under test.

2. The method of claim 1, wherein said coupling said input of said source follower circuit is performed by selectively enabling one of a set of sense transistors each having a first channel connection connected to a source terminal of each of said multiple devices within a row of said array, and a second channel connection connected to said input of said source follower circuit.

3. The method of claim 1, wherein said coupling said output of said source follower circuit is performed by selectively enabling one of a set buffers each having an input connected to said output of said source follower and an output connected to a drain of said multiple devices within a column of said array.

4. The method of claim 1, wherein said providing a predetermined gate voltage is performed by selectively enabling one of a set buffers each having an input connected to a reference voltage and an output connected to a gate of said multiple devices within a column of said array.

* * * * *